US006140022A

United States Patent [19]

Van Damme et al.

[11] Patent Number: 6,140,022

[45] Date of Patent: *Oct. 31, 2000

[54] RADIATION SENSITIVE IMAGING ELEMENT AND A METHOD FOR PRODUCING LITHOGRAPHIC PLATES THEREWITH

[75] Inventors: Marc Van Damme, Heverlee; Joan Vermeersch, Deinze, both of Belgium

[73] Assignee: Agfa-Gevaert, N.V., Mortsel, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/889,445

[22] Filed: Jul. 8, 1997

Related U.S. Application Data

[60] Provisional application No. 60/026,781, Sep. 20, 1996.

[30] Foreign Application Priority Data

Jul. 19, 1996 [EP] European Pat. Off. .............. 96202051

[51] Int. Cl.[7] ........................ G03F 7/30

[52] U.S. Cl. .................. 430/302; 430/270.1; 430/278.1; 430/944

[58] Field of Search .................. 430/158, 159, 430/160, 176, 177, 179, 302, 270.1, 278.1, 944

[56] References Cited

U.S. PATENT DOCUMENTS

| | | | |
|---|---|---|---|
| 5,310,618 | 5/1994 | Kawamura | 430/157 |
| 5,372,915 | 12/1994 | Haley et al. | 430/302 |
| 5,403,694 | 4/1995 | Vermeersch et al. | 430/159 |
| 5,424,166 | 6/1995 | Pawlowski et al. | 430/157 |
| 5,478,690 | 12/1995 | Kanda et al. | 430/175 |
| 5,496,678 | 3/1996 | Imai et al. | 430/176 |
| 5,527,659 | 6/1996 | Yamaoka et al. | 430/179 |
| 5,629,135 | 5/1997 | Kobayashi et al. | 430/270.1 |
| 5,639,586 | 6/1997 | Hauquier et al. | 430/159 |
| 5,641,608 | 6/1997 | Grunwald et al. | 430/302 |
| 5,650,261 | 7/1997 | Winkle | 430/270.1 |
| 5,688,629 | 11/1997 | Gries | 430/254 |
| 5,705,322 | 1/1998 | West | 430/325 |
| 6,060,218 | 5/2000 | Van Damme | 430/302 |

*Primary Examiner*—Kathleen Duda
*Attorney, Agent, or Firm*—Breiner & Breiner

[57] ABSTRACT

According to the present invention there is provided a radiation sensitive imaging element comprising on a hydrophilic surface of a lithographic base an image forming layer comprising (1) an alkali soluble or swellable resin having a phenolic hydroxy group, (2) a latent Bronsted acid, and (3) an infrared absorber, characterized in that said image forming layer comprises an amino crosslinking agent.

1 Claim, No Drawings

RADIATION SENSITIVE IMAGING ELEMENT AND A METHOD FOR PRODUCING LITHOGRAPHIC PLATES THEREWITH

This application claims the benefit of U.S. Provisional No. 60/026,781 filed Sep. 20, 1996.

FIELD OF THE INVENTION

The present invention relates to a radiation sensitive material for making a lithographic printing plate. The present invention further relates to a method for preparing a printing plate from said radiation sensitive material.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they are less suited for computer-to-plate imaging. The trend towards heat sensitive printing plate precursors is clearly seen on the market.

For example, EP-A 952022871.0, 952022872.8, 952022873.6 and 952022874.4 disclose a method for making a lithographic printing plate comprising the steps of (1) image-wise exposing to light a heat sensitive imaging element comprising (i) on a hydrophilic surface of a lithographic base an image forming layer comprising hydrophobic thermoplastic polymer particles dispersed in a hydrophilic binder and (ii) a compound capable of converting light to heat, said compound being comprised in said image forming layer or a layer adjacent thereto; (2) and developing a thus obtained image-wise exposed element by rinsing it with plain water.

EP-A 625728 discloses a lithographic plate with an image forming layer which is UV- and IR-sensitive which can be as well positive as negative working. Said image forming layer comprises (1) a resole resin, (2) a novolac resin, (3) a latent Bronsted acid and (4) an IR absorber. By exposing with UV or IR (830 nm) light followed by a classical PS-plate development a positive working lithographic plate is obtained. If the plate is baked (60 seconds at 100° C.) before the development step a negative working printing plate is obtained.

EP-A-483,693 discloses a photosensitive colored resin composition for the formation of colored images, including (a) a resib-based material hardenable with an acid, (b) a photoreactive acid-releasing agent and (c) a pigment.

U.S. Pat. No. 4,708,925 discloses a positive working printing plate comprising a light sensitive composition comprising (1) an alkali-soluble novolac resin and an onium-salt and optionally an IR spectral sensitizing dye. By exposing with UV, visible or IR light followed by a development step with an alkali solution there is obtained a positive working printing plate.

SUMMARY OF THE INVENTION

It is an object of the present invention to provide an imaging element being infrared light and heat sensitive to facilitate digital imaging by exposure to infrared radiation or a thermal printing head.

It is a further object of the present invention to provide an imaging element being ultraviolet light sensitive to facilitate optical imaging by exposure to ultraviolet radiation through an imaging master.

It is still a further object of the present invention to provide an imaging element being substantially insensitive to visible radiation so as to facilitate room-light-handling.

It is another object of the present invention to provide a method for obtaining in a convenient way a negative working lithographic printing plate of a high quality using said imaging element.

Further objects of the present invention will become clear from the description hereinafter.

According to the present invention there is provided a radiation-sensitive imaging element comprising on a hydrophilic surface of a lithographic base an image forming layer comprising (1) an alkali soluble or swellable resin having a phenolic hydroxy group, (2) a latent Bronsted acid, and (3) an infrared absorber, characterized in that said image forming layer comprises an amino crosslinking agent.

According to the present invention there is also provided a method for obtaining a negative working lithographic printing plate comprising the steps of:

(a) image-wise or information-wise exposing to UV or IR light or heat an imaging element as described above;

(b) heating said exposed imaging element to provide reduced solubility in the exposed areas;

(c) developing said exposed and heated imaging element with an aqueous alkaline developing solution in order to remove the unexposed areas and thereby form a lithographic printing plate.

DETAILED DESCRIPTION OF THE INVENTION

It has been found that imaging elements which are recordable with UV and IR radiation and heat and which yield lithographic printing plates of high quality can be obtained according to the method of the present invention using an imaging element as described above.

To utilize it as a negative-working plate requires the steps of imagewise exposure to activating radiation, heating of the plate to provide reduced solubility in exposed areas and contact with an aqueous alkaline processing solution to remove the unexposed areas. In contrast with the printing plates of EP-A 625728 use of both a resole resin and a novolac resin is not necessary and the use of both a alkali soluble or swellable resin having a phenolic hydroxy group and an amino crosslinking agent is essential.

While applicants do not wish to be bound by any theoretical explanation for the manner in which their invention functions, it is believed that it is based upon an acid-catalyzed chemical amplification mechanism which occurs upon heating of the exposed plate. This mechanism reduces the solubility of the exposed areas by hardening the mixture of resins.

The functioning of the plate as a negative-working plate is critically dependent upon the use of a mixture of an amino crosslinking agent and a alkali soluble or swellable resin having a phenolic hydroxy group since the use of either compound alone does not provide a useful developed image.

Exposure of the plate to infrared radiation is believed to decompose both the infrared absorber and the latent Bronsted acid in the exposed areas. The decomposition products are believed to catalyze a reaction between the amino crosslinking agent and the alkali soluble or swellable resin having a phenolic hydroxy group to form a matrix which after heating is insoluble in aqueous alkaline developing solution.

Exposure to ultraviolet radiation also results in decomposition of the latent Bronsted acid to generate a Bronsted acid which catalyzes the matrix-forming reaction between the amino crosslinking agent and the alkali soluble or swellable resin having a phenolic hydroxy compound. The plate has a high degree of sensitivity in both the ultraviolet and infrared regions of the spectrum. In other words, it can be exposed at two different wavelengths.

An amino crosslinking agent according to the invention is preferably a compound obtainable by the condensation of an amino group containing substance and formaldehyde. Said amino crosslinking agent has paired functional groups attached to the amino nitrogens. The three most common paired groups may be represented as follows $$—N(CH_2OR)_2,\ —N(CH_2OH)CH_2OR\ ,\ —N(H)CH_2OR$$

where R is generally a low molecular weight alkyl group such as methyl, ethyl, butyl or isobutyl.

Preferably said amino crosslinking agent is a compound selected from the group consisting of melamine-formaldehyde resins, (thio)urea-formaldehyde resins, guanamine-formaldehyde resins, benzoguanamine-formaldehyde resins and glycoluril-formaldehyde resins. Some of said compounds are commercially available under the registered trade marks CYMEL or DYNOMIN from Dyno Cyanamid.

Suitable resins having phenolic hydroxy groups for use in an image forming layer in connection with this invention are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyno Cyanamid.

The third essential ingredient of the radiation-sensitive composition of this invention is a latent Bronsted acid. The term "latent Bronsted acid" refers to a precursor which forms a Bronsted acid by decomposition. The Bronsted acid is believed to catalyze the matrix-forming reaction between the amino crosslinking agent and the resin having phenolic hydroxy groups. Typical examples of Bronsted acids which are suitable for this purpose are sulphonic acids e.g. trifluoromethane sulphonic acid and hexafluorophosphoric acid.

Ionic latent Bronsted acids are suitable for use in this invention. Examples of these include onium salts, in particular iodonium, sulfonium, phosphonium, selenonium, diazonium and arsonium salts.

Useful ionic latent Bronsted acids include those represented by the formula $$X^+R_1R_2R_3R_4\ W^-$$

When X is iodine then $R_3$ and $R_4$ are electron lone pairs and $R_1$ and $R_2$ each independently are aryl or substituted aryl groups. When X is S or Se then $R_4$ is an electron lone pair and $R_1$, $R_2$ and $R_3$ each independently can be an aryl group, a substituted aryl group, an aliphatic group or a substituted aliphatic group. When X is P or As, then $R_1$, $R_2$, $R_3$ and $R_4$ each independently can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708,925 can be utilized as the latent Bronsted acid in this invention. These include iodonium, sulfonium, phosphonium, bromonium, chloronium, oxysulfoxonium, oxysulfonium, sulfoxonium, selenonium, telluronium and arsonium salts.

Use of diazonium salts as latent Bronsted acids is particularly preferred in this invention. They provide equivalent sensitivity to other latent Bronsted acids in the infrared region and higher sensitivity in the ultraviolet region.

Specific examples of particularly useful onium salts include diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Non-ionic latent Bronsted acids are also suitable for use in this invention. Examples of these include compounds of the formula $$RCH_2X,\ RCHX_2,\ RCX_3,\ R(CH_2X)_2 \text{ and } R(CH_2X)_3$$

wherein X is Cl, Br, F, or $CF_3SO_3$ and R is an aromatic group or an aliphatic group.

Further suitable non-ionic latent Bronsted acids are haloalkyl-substituted s-triazines as disclosed in EP-A 672954, o-quinone diazides, photo acid generating agents having an o-nitrobenzyl type protective group as described in *Polymer Sci.,* by S. Hayase et al, 25, 573 (1987); the compounds which are subjected to a photodecomposition to generate a sulfonic acid, represented by iminosulfonates as described in *Polymer Preprints* Japan, by M. Tunooka et al, 35 (8), by disulfon compounds described in JP-Pi 61-166544, by α-sulphonyloxy ketones, by α-hydroxymethylbenzoine sulphonates, by nitrobenzyl sulphonates, by α-sulphonyl acetophenones and by sulphonyl imides, the preparation of these last compounds being well known in the literature; the compounds which are subjected to a photodecomposition to generate a phosphonic acid, a partly esterified phosphoric acid or phosphoric acid, represented by nitrobenzylphosphates or phosphonates as described in *Tetrahedron Letters,* by M. Rubinstein et al., 17, 1445 (1975), by benzoine phosphates or phosphonates, as described in *J. Org. Chem.* by M. Pirrung and S. Shuey, 59, 3890 (1994), by pyrenemethylphosphates or phosphonates, by iminophosphates or phosphonates and by imidophosphates or phosphonates, the preparation of these last compounds being well known in the literature.

Further, compounds in which the above photosensitive acid precursors are introduced into a primary chain or a side chain of a polymer can be used. Examples thereof include the compounds described in e.g. *J. Am. Chem. Soc.,* by M. E. Woodhouse et al, 104, 5586 (1982); *J. Imaging Sci.,* by S. P. Pappas et al, 30 (5), 218 (1986); etc.

The fourth essential ingredient of the radiation-sensitive composition of this invention is an infrared absorber. The infrared absorber renders the composition sensitive to infrared radiation and makes the printing plate useful as a direct laser addressable plate which can be imaged by exposure to a laser which emits in the infrared region.

The infrared absorber can be a dye or pigment. A very wide range of such compounds is well known in the art and includes dyes or pigments of the squarylium, croconate, cyanine, merocyanine, indolizine, pyrylium and metal dithiolene classes. It is preferred that the infrared absorber fragments upon exposure to the activating radiation since the decomposition products promote increased contrast between image and non-image areas and thereby help in the development process.

Additional infrared absorbers that are of utility in this invention include those described in U.S. Pat. No. 5,166,024, issued Nov. 24, 1992. As described in the '024 patent, particularly useful infrared absorbers are phthalocyanine pigments.

As explained hereinabove, the four essential ingredients of the radiation-sensitive composition of this invention are an amino crosslinking agent, a resin having phenolic hydroxy groups, a latent Bronsted acid and an infrared absorber. Other ingredients which can optionally be incorporated in the composition include colorants, stabilizers, additional sensitizers, exposure indicators and surfactants.

The thickness of the image forming layer in the printing plates of this invention can vary widely. Typically, a dry thickness in the range of from 0.5 to 10 micrometers, more preferably from 1 to 5 micrometers is suitable.

To form the radiation sensitive imaging element, the amino crosslinking agent, the resin having phenolic hydroxy groups, the latent Bronsted acid and the infrared absorber are dissolved or dispersed in a suitable solvent in appropriate proportions and coated on the support using such well-known coating techniques as spin coating or hopper coating. Preferred solvents include acetone, methylethylketone and 1-methoxy-2-propanol.

The amino crosslinking agent is preferably incorporated in the coating composition in an amount of from 0.5 to 10 percent by weight, more preferably from 1 to 6 percent by weight, and most preferably from 2.0 to 4.0 percent by weight.

The resin having phenolic hydroxy groups is preferably incorporated in the coating composition in an amount of from 1.0 to 20 percent by weight, more preferably from 3.5 to 9 percent by weight, and most preferably from 5.0 to 7.5 percent by weight.

The latent Bronsted acid is preferably incorporated in the coating composition in an amount of from 0.1 to 2 percent by weight, more preferably from 0.25 to 0.9 percent by weight, and most preferably from 0.35 to 0.70 percent by weight.

The infrared absorber is preferably incorporated in the coating composition in an amount of from 0.1 to 1.5 percent by weight, more preferably from 0.15 to 1.0 percent by weight, and most preferably from 0.20 to 0.40 percent by weight.

Suitable conditions for drying the layer involve heating for a period of from 0.5 to 10 minutes at a temperature in the range of from 20° C. to 150° C.

According to one embodiment of the present invention, the lithographic base can be an anodised aluminum support. A particularly preferred lithographic base is an electrochemically grained and anodised aluminum support. According to the present invention, an anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. An interesting treatment involves treating the aluminum oxide surface with polyvinyl phosphonic acid as disclosed in DE-OS 2,607,207. A further interesting treatment involves rinsing the aluminum oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc. The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

The lithographic printing plates of this invention can be exposed with a laser diode which emits radiation in the near-infrared region of the spectrum. Such laser diodes provide the advantage of both low cost and low energy consumption. The lithographic printing plates can also be exposed with conventional ultraviolet radiation sources, including carbon arc lamps, mercury vapor lamps, fluorescent lamps, tungsten filament lamps and photoflood lamps.

A particularly suitable exposing device is a laser diode with a maximum output at about 830 nanometers. Such a device is typically capable of decomposing both the latent Bronsted acid and the infrared absorber in the exposed areas. The products from the thermal decomposition are mainly strong acids which are effective in crosslinking the resins, thereby altering solubility in aqueous alkaline developing solution.

As described hereinabove, the imagewise-exposed plate is heated in a step that is referred to as a post-exposure bake or PEB the heating step is conducted at a temperature in the range of from 70° C. to 150° C. for a period of from 15 to 300 seconds. More preferably, the heating is for a period of from 30 to 90 seconds at a temperature in the range of from 80° C. to 135° C. After the PEB is completed, the plate is then either hand processed or machine processed in an aqueous alkaline developing solution until the non-image areas are removed. This typically requires 30 to 120 seconds. A preferred aqueous alkaline developing solution is a silicate solution such as a six percent by weight aqueous solution of sodium meta-silicate. A suitable commercially available silicate solution for this purpose is KODAK AQUA-IMAGE POSITIVE DEVELOPER MX-1406-1 which is sold by Eastman Kodak Company or Fuji PS-plate developer DP-5 which is sold by Fuji Company. After contact with the aqueous alkaline developing solution, the plate is usually treated with a finisher such as gum arabic.

The number of printing impressions obtainable is primarily dependent upon use of a post development baking step. If no such baking step is used, the plate typically provides 60000 to 70000 impressions, whereas post development baking for 5 minutes at 250° C. typically provides 300000 to 350000 impressions. The number of impressions that can be attained before wear is detected can also be increased by increasing the coating weight.

Since the printing plate of this invention is infrared light sensitive, digital imaging information can be conveniently utilized to form continuous or halftone images using a suitable source of infrared radiation such as a laser diode emitting in the infrared region. Since the printing plate of this invention is also ultraviolet light sensitive, it can also be conveniently imaged so as to form continuous or halftone images by ultraviolet light exposure through a suitable imaging master such as a silver halide film. Because of these characteristics, the same plate can be utilized in equipment intended for input of electronic data by writing with a laser or in the type of equipment that is commonly employed to carry out ultraviolet light exposure of lithographic printing plates. It is thus an easy matter to combine digital or electronic imaging techniques with conventional optical imaging techniques, i.e., to use both types of imaging with the same printing plate. Accordingly information not available in an electronic format can be added by optical imaging techniques to complete the imaging of the lithographic printing plate when it is desired to do so.

The following examples illustrate the present invention without however, limiting it thereto. All parts, percentages and ratios are by weight unless otherwise indicated.

EXAMPLE 1

Preparation of the lithographic base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/$m^2$ to form a surface topography with an average center-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized at 25° C. for 30 seconds.

The foil was subsequently subjected to anodic oxidation in an aqueous solution containing 200 g/l of sulfuric acid at a temperature of 45° C., a voltage of about 10 V and a current density of 150 A/$m^2$ for about 300 seconds to form an anodic oxidation film of 3.00 g/$m^2$ of $Al_2O_3$, then washed with demineralized water, posttreated with a solution containing 20 g/l of sodium bicarbonate at 40° C. for 30 seconds, subsequently rinsed with demineralized water at 20° C. during 120 seconds and dried.

Preparation of the imaging element

The IR-sensitive layer was coated on the lithographic aluminum base from a 10% w/w solution of 90% w/w methyl ethyl ketone and 10% w/w methanol with a wet layer thickness of 30 $\mu$m. The resulting dry IR-sensitive layer had the following composition:

63% w/w MARUKA LYNCUR M H-2 (homopolymer of polyvinylphenol from Maruzen Co), 29% w/w CYMEL 303 (hexamethoxymethyl melamine from Dyno Cyanamid), 5% w/w TRIAZINE S (2,4,6-(trichloromethyl)-s-triazine from P.C.A.S.) and 3% w/w of IR-absorber I.

IR-absorber I

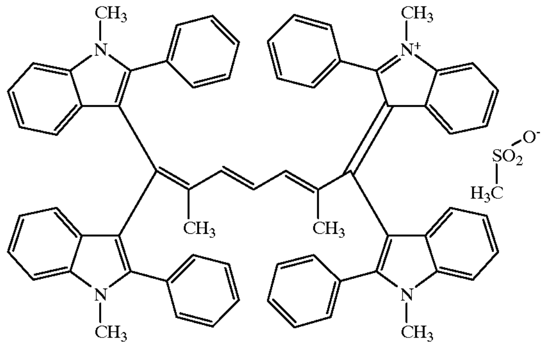

Preparation of the printing plate

The IR-sensitive imaging element was subjected to a scanning diode laser emitting at 830 nm (scanspeed 2 m/s, spot size 9.6 μm and the power on plate surface was varied from 60 to 120 mW). After imaging the plate was heated in an oven for 150 seconds at 115° C. and cooled to room temperature. The imaging element was then processed with Fuji PS-plate developer DP-5 to remove the unexposed areas resulting in a negative working lithographic printing plate.

The obtained image on the lithographic base could be used to print on a conventional offset press using a commonly employed ink and fountain. Excellent copies were obtained.

EXAMPLE 2

A lithographic printing plate was prepared in an identical manner as the lithographic printing plate of example 1 except that IR-absorber II was used instead of IR-absorber I and that the imaged plate was heated at 135° C. instead of 115° C. prior to developing. Results similar to those described in example 1 were achieved.

IR-absorber II

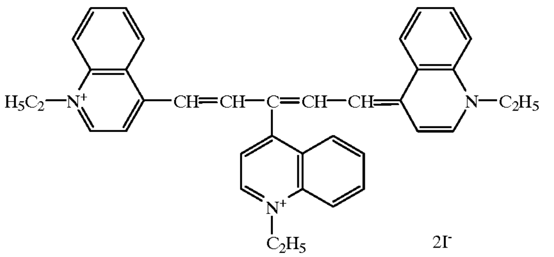

EXAMPLE 3

A lithographic printing plate was prepared in an identical way as the lithographic printing plate of example 1 except that 9-fluorenilidene imino tosylate was used instead of TRIAZINE S.

Results similar to those described in example 1 were achieved.

EXAMPLE 4

A lithographic printing plate was prepared in an identical way as the lithographic printing plate of example 1 except that NOVOLAK N3 (phenol-formaldehyde resin from Soc. Belge de l'Azote) was used instead of MARUKA LYNCUR M H-2 and that the imaged plate was heated at 90° C. instead of 115° C. prior to developing. Results similar to those described in example 1 were achieved.

EXAMPLE 5

A lithographic printing plate was prepared in an identical manner as the lithographic printing plate of example 1 except that ALNOVOL PN430 (phenol-formaldehyde resin from Reichold Hoechst) was used instead of MARUKA LYNCUR M H-2 and that the imaged plate was heated at 110° C. instead of 115° C. prior to developing. Results similar to those described in example 1 were achieved.

EXAMPLE 6

A lithographic printing plate was prepared in an identical manner as the lithographic printing plate of example 1 except that ALNOVOL PN844 (phenol-formaldehyde resin from Reichold Hoechst) was used instead of MARUKA LYNCUR M H-2 and that the imaged plate was heated at 110° C. instead of 115° C. prior to developing. Results similar to those described in example 1 were achieved.

EXAMPLE 7

On top of the imaging element of example 1 was placed in face-to face contact a test target with 60 lines per cm as well as fine positive and negative lines, and the imaging element was exposed therethrough to ultraviolet radiation. The exposed plate was then heated in an oven for 150 seconds at 115° C. and cooled to room temperature. The imaging element was then processed with Fuji PS-plate developer DP-5 to remove the unexposed areas resulting in a negative working lithographic printing plate. The obtained image on the lithographic base could be used to print on a conventional offset press using a commonly employed ink and fountain. Excellent copies were obtained.

What is claimed is:

1. A method for obtaining a negative working lithographic printing plate comprising the steps of:

(a) image-wise or information-wise exposing to IR light or heat an imaging element comprising on a flexible support, having thereon a cross-linked hydrophilic layer, an image forming layer including (1) an alkali soluble or swellable resin having a phenolic hydroxy group, (2) a latent Bronsted acid, (3) an infrared absorber, and (4) an amino cross-linking agent, wherein said infrared absorber is a dye or pigment selected from the group consisting of the croconate, cyanine. merocyanine, indolizine, pyrylium and metal dithiolene compounds;

(b) heating said exposed imaging element to provide reduced solubility in the exposed areas;

(c) developing said exposed and heated imaging element with an aqueous alkaline developing solution in order to remove the unexposed areas and thereby form a lithographic printing plate.

* * * * *